(12) United States Patent (10) Patent No.: US 7,804,374 B1
Brown et al. (45) Date of Patent: Sep. 28, 2010

(54) FEEDTHROUGH CAPACITANCE COMPENSATION FOR RESONANT DEVICES

(75) Inventors: Andrew R. Brown, Northville, MI (US);
Wan-Thai Hsu, Saline, MI (US);
Kenneth R. Cioffi, San Jose, CA (US)

(73) Assignee: Discera, Inc., San Jose, CA (US)

( * ) Notice: Subject to any disclaimer, the term of this patent is extended or adjusted under 35 U.S.C. 154(b) by 87 days.

(21) Appl. No.: 11/779,067

(22) Filed: Jul. 17, 2007

Related U.S. Application Data

(60) Provisional application No. 60/889,985, filed on Feb. 15, 2007.

(51) Int. Cl.
*H03B 5/36* (2006.01)

(52) U.S. Cl. .................. 331/116 R; 331/57; 331/96; 331/116 FE; 331/116 M; 331/117 D; 331/139; 331/154; 331/158

(58) Field of Classification Search ............ 331/57, 331/96, 116 R, 116 FE, 116 M, 117 D, 154, 331/158, 139
See application file for complete search history.

(56) References Cited

U.S. PATENT DOCUMENTS

| | | | | |
|---|---|---|---|---|
| 3,657,561 A | * | 4/1972 | Riekers et al. | 327/46 |
| 3,731,230 A | * | 5/1973 | Cerny, Jr. | 331/116 R |
| 4,100,512 A | * | 7/1978 | Valdois et al. | 331/158 |
| 4,358,742 A | * | 11/1982 | Ferriss | 331/158 |
| 4,607,239 A | * | 8/1986 | Ballato | 331/176 |
| 4,782,309 A | * | 11/1988 | Benjaminson | 331/158 |
| 5,047,734 A | * | 9/1991 | Newell et al. | 331/46 |
| 5,136,263 A | * | 8/1992 | Lane | 331/158 |
| 5,361,045 A | * | 11/1994 | Beaussier et al. | 331/154 |
| 5,801,411 A | * | 9/1998 | Klughart | 257/296 |
| 6,566,786 B2 | | 5/2003 | Nguyen | |

(Continued)

FOREIGN PATENT DOCUMENTS

WO WO2007011307 * 1/2007

OTHER PUBLICATIONS

Rantakari, et al., "Reducing the Effect of Parasitic Capacitance on MEMS Measurements," *The 11th International Conference on Solid-State Sensors and Actuators*, Munich, Germany (2001).

(Continued)

*Primary Examiner*—Arnold Kinkead
*Assistant Examiner*—Richard Tan
(74) *Attorney, Agent, or Firm*—Lempia Braidwood LLC

(57) ABSTRACT

A device has a resonator coupled to input and output nodes, the resonator being characterized by a transducer to drive the output node, and further characterized by a feedthrough capacitance such that portions of the input signal bypass the transducer to allow a spurious signal to reach the output node. The device includes a compensation capacitor coupled to the output node to define a compensation capacitance in accordance with the feedthrough capacitance. A phase inversion circuit is coupled to the compensation capacitance to generate a compensation signal and coupled to the output node such that the spurious signal is offset by the compensation signal. In some cases, a differential amplifier of the phase inversion circuit has the compensation capacitance in a feedback path to offset the feedthrough capacitance. In these and other cases, the compensation capacitance and the feedthrough capacitance may be unmatched to avoid overcompensation.

27 Claims, 15 Drawing Sheets

U.S. PATENT DOCUMENTS

| | | |
|---|---|---|
| 6,577,040 B2 | 6/2003 | Nguyen |
| 6,933,794 B2 * | 8/2005 | Ogiso .................... 331/107 A |
| 7,075,381 B2 * | 7/2006 | Hashimoto ................. 331/158 |
| 2004/0233008 A1 * | 11/2004 | Kobayashi ................. 331/158 |
| 2005/0275480 A1 * | 12/2005 | Nishio ....................... 331/158 |
| 2006/0061425 A1 * | 3/2006 | Arigliano ................. 331/36 C |

OTHER PUBLICATIONS

Wang, et al., "High Order Micromechanical Electronic Filters," *Proceedings*, 1997 IEEE International Micro Electro Mechanical Systems Workshop, Japan, pp. 25-30 (1997).

* cited by examiner

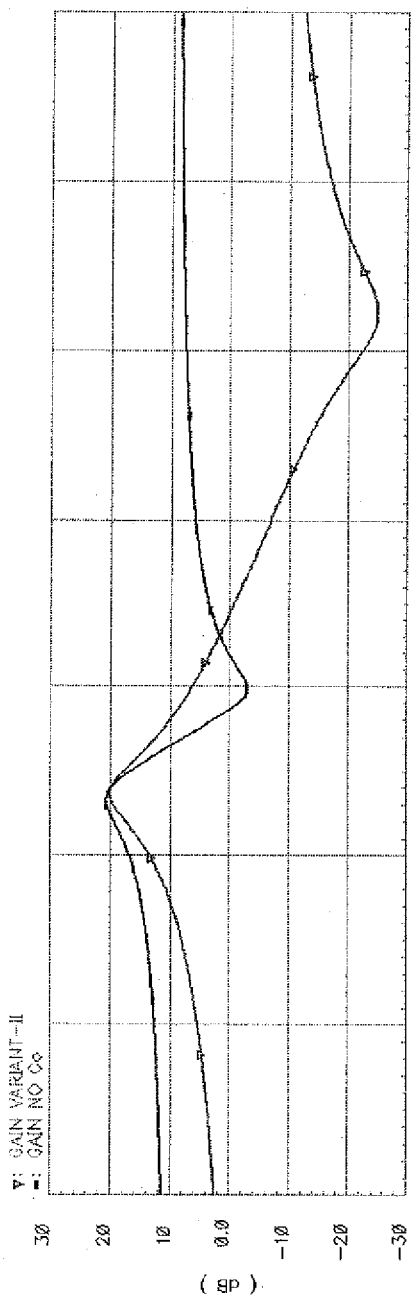
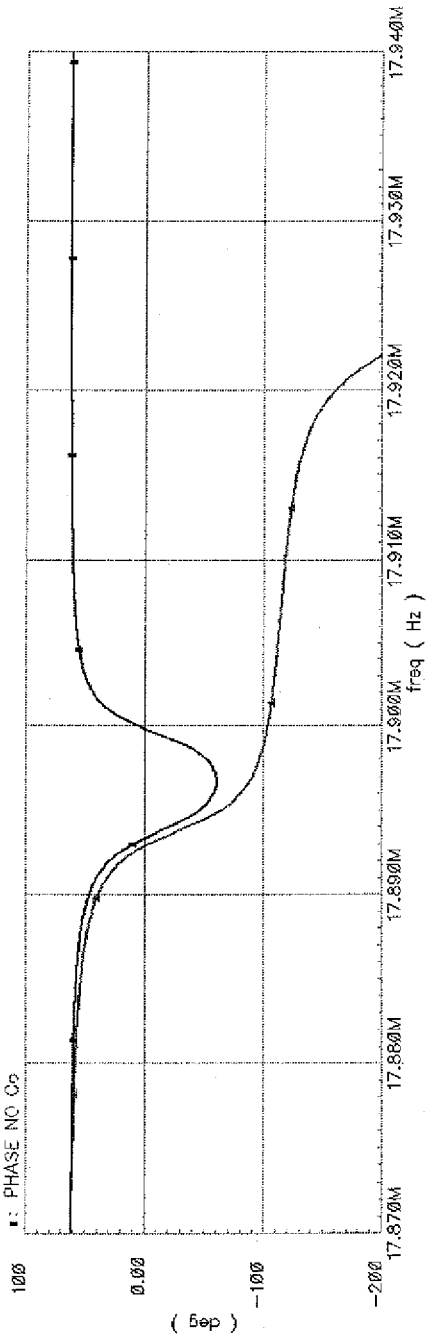
Figure 14A
Figure 14B

FEEDTHROUGH CAPACITANCE COMPENSATION FOR RESONANT DEVICES

CROSS-REFERENCE TO RELATED APPLICATION

This application claims the benefit of U.S. provisional application entitled "Parallel Capacitance Cancellation for Resonant Devices," filed Feb. 15, 2007, and having Ser. No. 60/889,985, the entire disclosure of which is hereby expressly incorporated by reference.

BACKGROUND OF THE DISCLOSURE

1. Field of the Disclosure

The disclosure relates generally to resonator devices characterized by a feedthrough capacitance and, more specifically, to devices having a compensation capacitance to offset the feedthrough capacitance.

2. Brief Description of Related Technology

Resonators are used in a variety of devices and applications involving the generation of a signal with an accurate and stable frequency. For example, oscillators have utilized resonators to generate clock signals of a reliably stable frequency. The frequency stability of an oscillator is often assessed in two ways—phase noise characteristics for short-term stability and aging characteristics for long-term stability. With their high frequency stability in both the short term and the long term, quartz crystal resonators have often been relied upon to meet the more stringent phase noise specifications of frequency reference and master clock applications.

Micromechanical or MEMS (microelectromechanical systems) resonators have been developed as an alternative to quartz crystal resonators for oscillator and other devices and applications. MEMS resonators are typically electrostatically actuated, but can also be actuated piezoelectrically, magnetically, and optically. For electrostatically actuated resonators, a resonant element of the MEMS device is spaced from a stationary drive electrode such that the MEMS device is coupled across an air gap. The coupling is a function of the time-varying capacitance resulting from the device vibration.

Unfortunately, the spacing between the elements of a MEMS resonator presents a feedthrough, static capacitance in addition to the time-varying capacitance. This feedthrough capacitance arises from the resonant element not vibrating the entire extent of the air gap, and generally allows a portion of the drive signal to pass through the device. As a result, the efficiency of the MEMS resonator is adversely impacted. For oscillator devices, overall stability may be compromised, as the oscillator may be allowed to operate at a parasitic resonance not under the influence of the primary device resonance. More generally, the static capacitance undesirably provides a feedthrough path from the input to the output, degrading performance with decreased frequency accuracy, increased phase noise and an increased noise floor.

Previous attempts at improving performance have been directed to altering the physical structure of the MEMS resonator to minimize the feedthrough capacitance. Unfortunately, altering the structure of the vibrating and other components of the MEMS resonator may introduce other complications and complexities.

SUMMARY OF THE DISCLOSURE

In accordance with one aspect of the disclosure, a device having an input node to receive an input signal and an output node to provide an output signal includes a differential amplifier coupled to the input and output nodes, and a resonator disposed in a first feedback path of the differential amplifier. The resonator is characterized by a transducer to drive the output node, and further characterized by a feedthrough capacitance such that portions of the input signal bypass the transducer to reach the output node. The device further includes a compensation capacitance disposed in a second feedback path of the differential amplifier to offset the feedthrough capacitance.

In some cases, the first and second feedback paths are configured in a differential input scheme. An inverting output of the differential amplifier may then be coupled to an unconnected pad. Alternatively, the first and second feedback paths are configured in a differential output scheme. An inverting input of the differential amplifier may then be coupled to an unconnected pad.

The device may include a series of amplification stages, one of which comprises the differential amplifier.

In some embodiments, the device further includes a phase shifter having components coupled to one or both of the first and second feedback paths for relative tuning of the first and second feedback paths. The components of the phase shifter may be tuned such that the first and second feedback paths are unmatched to avoid overcompensation.

The device may include an array of resonators that includes the resonator, as well as a set of compensation capacitances to offset a respective feedthrough capacitance of each resonator in the array, the set including the compensation capacitance. Each resonator of the array may be disposed in parallel with the first feedback path and each compensation capacitance of the set may be disposed in parallel with the second feedback path. Each resonator of the array may be a micromechanical resonator and each compensation capacitance of the set may include an unbiased micromechanical resonator.

In accordance with another aspect of the disclosure, a device having an input node to receive an input signal and an output node to provide an output signal includes a resonator coupled to the input and output nodes, the resonator being characterized by a transducer to drive the output node, and further characterized by a feedthrough capacitance such that portions of the input signal bypass the transducer to allow a spurious signal to reach the output node. The device further includes a compensation capacitor coupled to the output node to define a compensation capacitance in accordance with the feedthrough capacitance, and a phase inversion circuit coupled to the compensation capacitance to generate a compensation signal. The phase inversion circuit is coupled to the output node such that the spurious signal is offset by the compensation signal, with the compensation capacitance and the feedthrough capacitance being unmatched to avoid overcompensation.

In some cases, the phase inversion circuit includes an LC circuit configured to provide a 180 degree phase shift. Alternatively, the phase inversion circuit includes a center-tapped transformer.

The phase inversion circuit may include a differential amplifier. The compensation capacitor and the resonator may then be coupled to the differential amplifier in first and second feedback paths, respectively. The device may include a series of amplification stages, one of which includes the differential amplifier. The device may further include a phase shifter having components coupled to one or both of the first and second feedback paths for relative tuning of the first and second feedback paths. The components of the phase shifter may then be tuned to unmatch the first and second feedback paths to establish an offset between the spurious signal and the compensation signal to avoid the overcompensation.

In accordance with yet another aspect of the disclosure, a method of operating a device having a parallel array of resonators includes applying an activation voltage to a selected resonator of the parallel array of resonators, and driving compensation capacitance for each resonator in the parallel array of resonators to offset a respective feedthrough capacitance of each resonator in the parallel array of resonators.

The driving step may include generating a respective compensation signal for each resonator in the parallel array.

The compensation capacitance may be provided by a parallel set of compensation capacitances, each of which corresponds with a respective resonator in the parallel array to offset the feedthrough capacitance of the respective resonator. Each resonator of the parallel array may include a micromechanical resonator, and each compensation capacitance of the parallel set may include an unbiased micromechanical resonator.

In some applications of this aspect of the disclosure, the resonators of the parallel array of resonators other than the selected resonator may be unactivated.

BRIEF DESCRIPTION OF THE DRAWING FIGURES

For a more complete understanding of the disclosure, reference should be made to the following detailed description and accompanying drawing figures, in which like reference numerals identify like elements in the figures, and in which.

Figure 10:
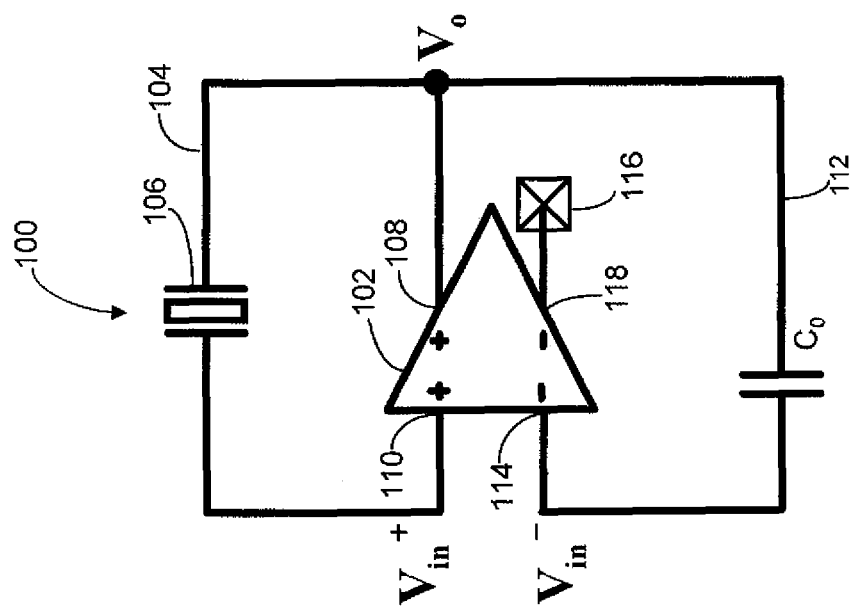
FIG. 10 is a circuit diagram of a device configured to implement an active feedthrough capacitance compensation technique in accordance with yet another exemplary embodiment.
Figure 11:
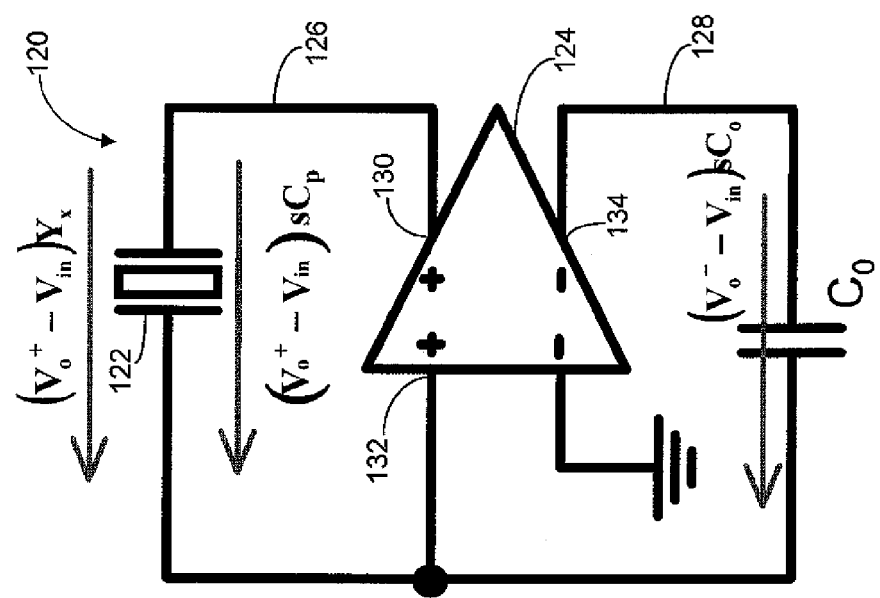
FIG. 11 is a circuit diagram of a device configured to implement an alternative active feedthrough capacitance compensation technique in accordance with another exemplary embodiment.
Figure 12B:
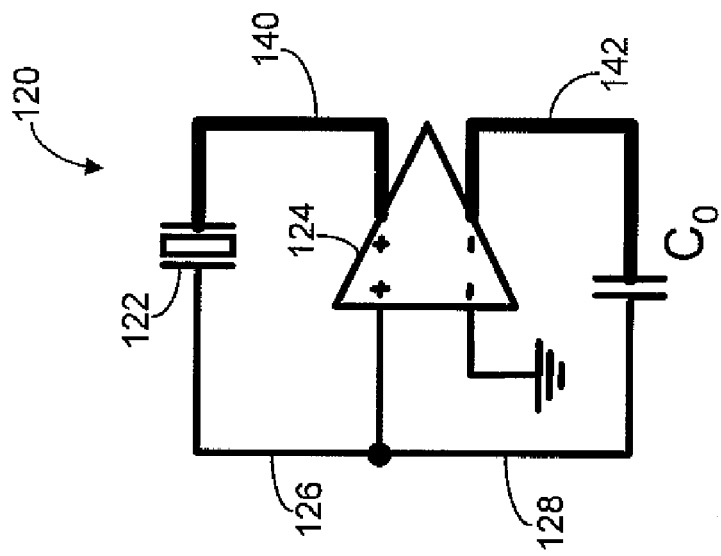
Figure 12A:
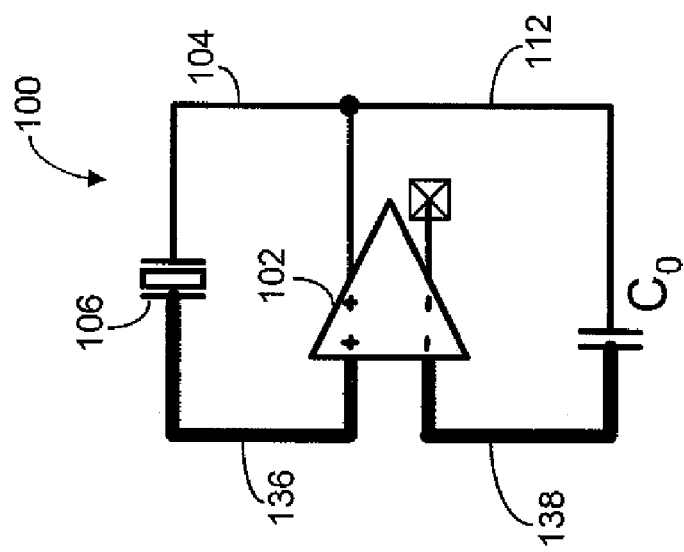
Figure 12D:
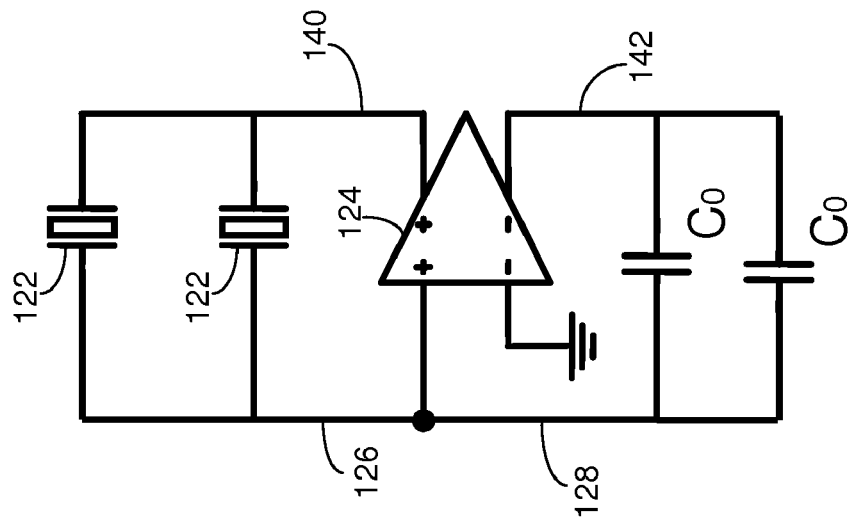
Figure 12C:
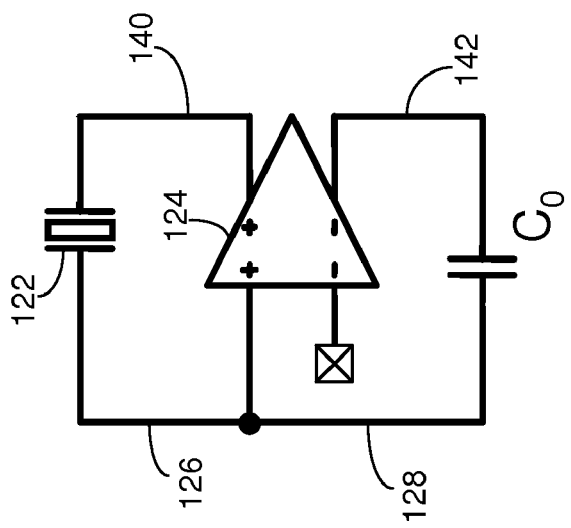
Figure 13A:
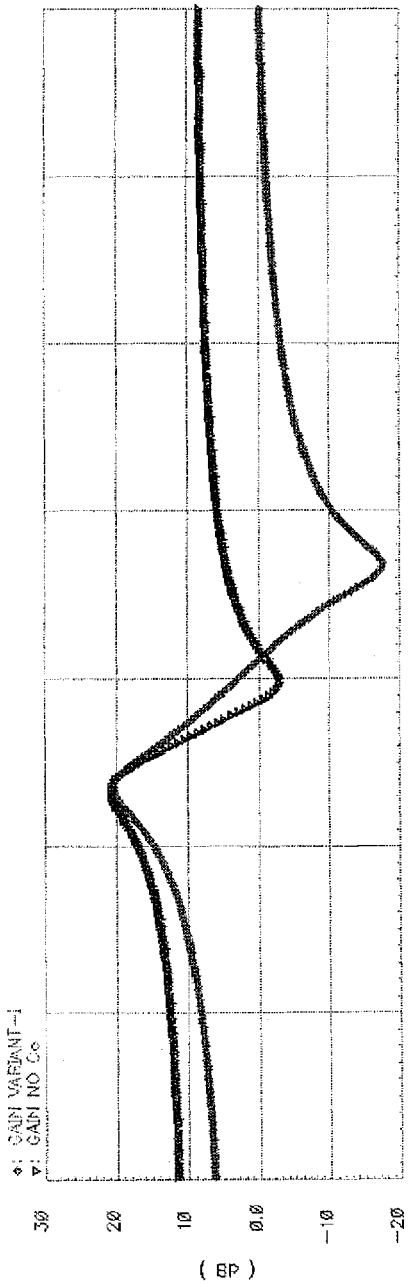
Figure 13B:
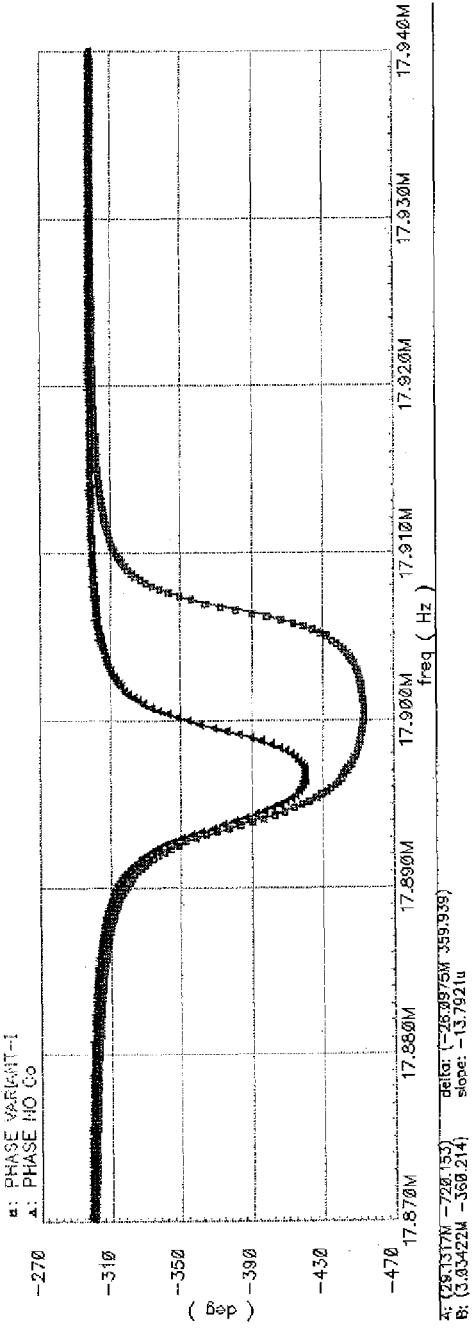
Figure 15:
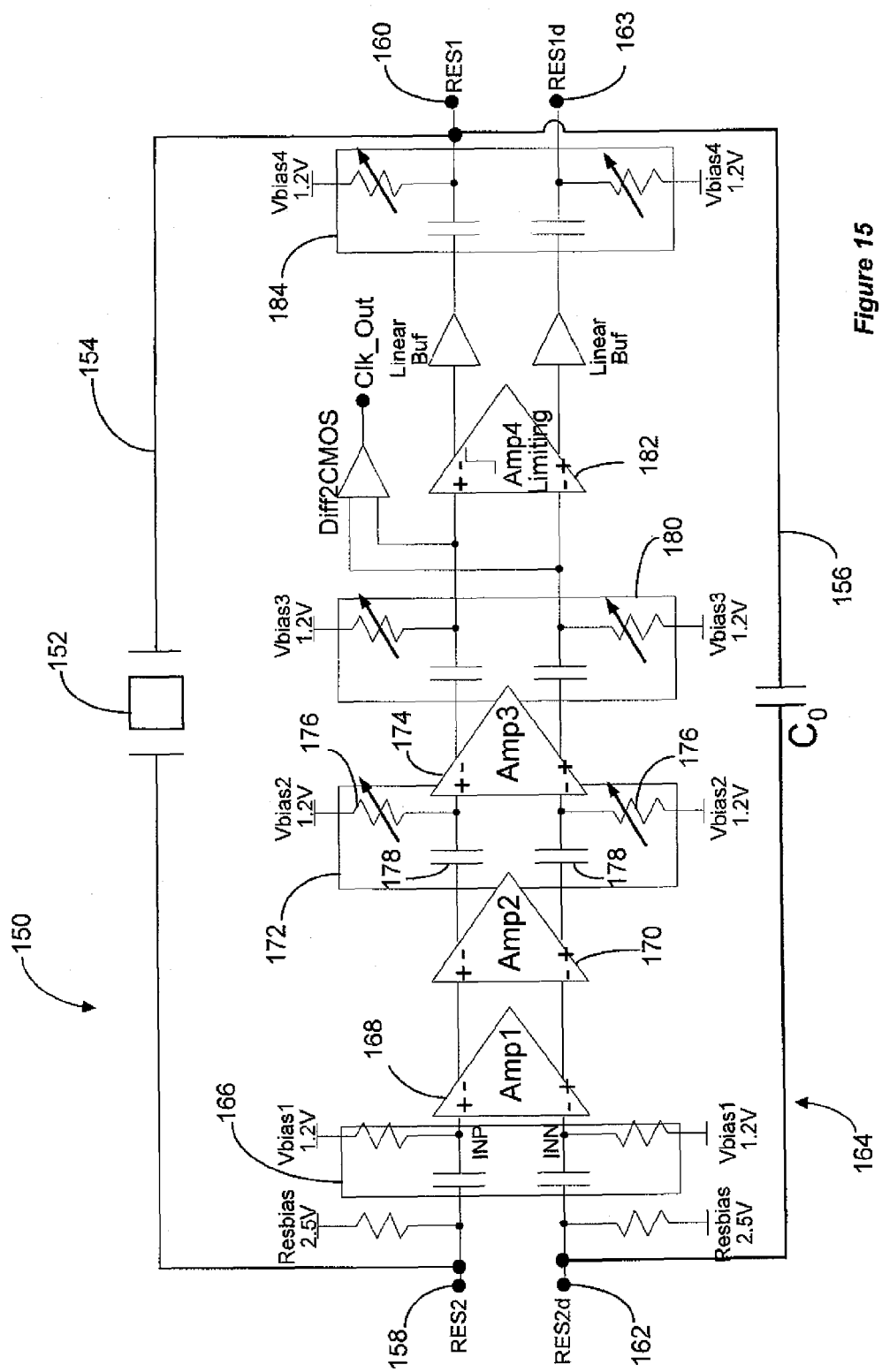
Figure 16:
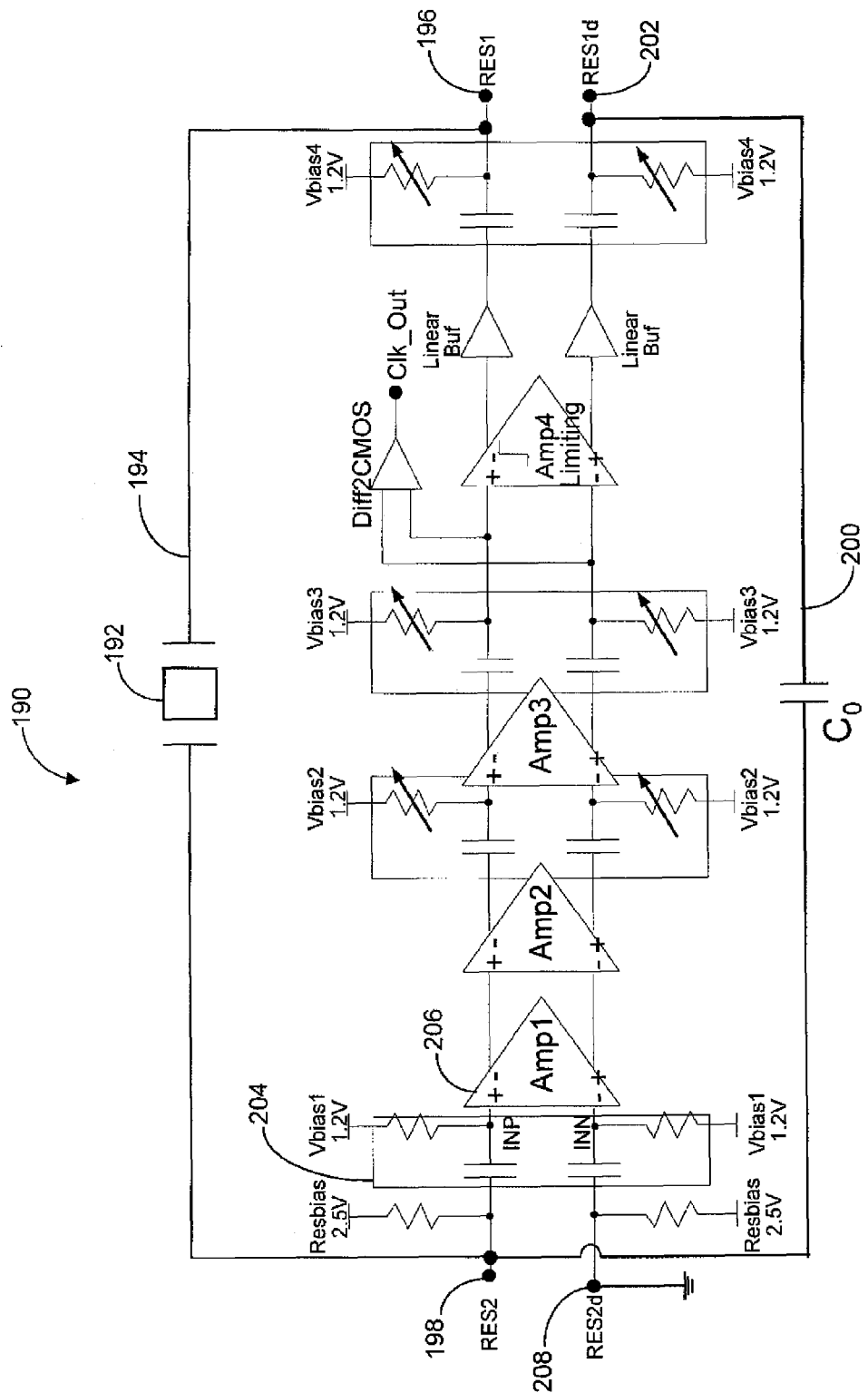

FIGS. 12A and 12B are circuit diagrams highlighting portions of feedback paths to be balanced in accordance with the active feedthrough capacitance compensation techniques illustrated in FIGS. 10 and 11, respectively, while FIGS. 12C and 12D are circuit diagrams of devices configured to implement alternative feedthrough capacitance compensation techniques involving an unconnected pad and an array of resonators, respectively;

FIGS. 13A and 13B are frequency response plots depicting the simulated operation of the embodiment of FIG. 10 both with and without feedthrough capacitance compensation;

FIGS. 14A and 14B are frequency response plots depicting the simulated operation of the embodiment of FIG. 11 both with and without feedthrough capacitance compensation;

FIG. 15 is a circuit diagram of another device configured to implement the active feedthrough capacitance compensation technique illustrated in FIG. 10; and FIG. 16 is a circuit diagram of another device configured to implement the active feedthrough capacitance compensation technique illustrated in FIG. 11.

While the disclosed devices and techniques are susceptible of embodiments in various forms, there are illustrated in the drawing (and will hereafter be described) specific embodiments of the invention, with the understanding that the disclosure is intended to be illustrative, and is not intended to limit the invention to the specific embodiments described and illustrated herein.

DETAILED DESCRIPTION OF PREFERRED EMBODIMENTS

This disclosure generally addresses a feedthrough capacitance present in micromechanical, or MEMS, resonators, and other resonant devices. In MEMS resonators, the feedthrough capacitance may be a static capacitance that arises from the resonant element not vibrating the entire extent of the air gap. The feedthrough capacitance may also arise from undesired feedthrough paths through the substrate, pad-to-pad capacitance, or other parasitic forms of capacitance resulting in degraded device isolation. More generally, the feedthrough capacitance creates a path that bypasses the transducer of the resonator, allowing a portion of the input (or drive) signals to reach the output node. The disclosed devices address the feedthrough capacitance to avoid the reductions in efficiency and adverse impact on device performance that would otherwise result.

Generally speaking, described herein are techniques and devices that utilize compensation circuitry to offset spurious signals resulting from the feedthrough path. The disclosed techniques and devices thus counteract the spurious signals rather than attempt to remove or minimize the feedthrough path. In this way, modifications to the resonator structure are not necessary.

In some cases, one or more tuning capacitors may be utilized to avoid overcompensation, including, for instance, where the compensation circuitry involves a matching or companion resonator. As described below, the disclosed devices may include compensation circuitry having a capacitor or capacitance not exactly matched to the feedthrough capacitance of the resonator. Some of the disclosed devices may utilize active compensation to provide additional design flexibility.

Although described below in connection with micromechanical or MEMS resonators, the disclosed techniques and devices are well suited for use with a variety of resonators the performance of which can be impacted by a feedthrough capacitance. Thus, practice of the disclosed techniques is not limited to electrostatically driven resonators, micromechanical resonators, or MEMS resonators. For example, the disclosed techniques may be applied in contexts involving other types of resonant devices, such as quartz and other piezoelectric resonators that may be adversely impacted by feedthrough capacitance. In this way, the disclosed techniques can improve the isolation of devices that would otherwise be performance-limited by feedthrough capacitance.

Figure 1B:
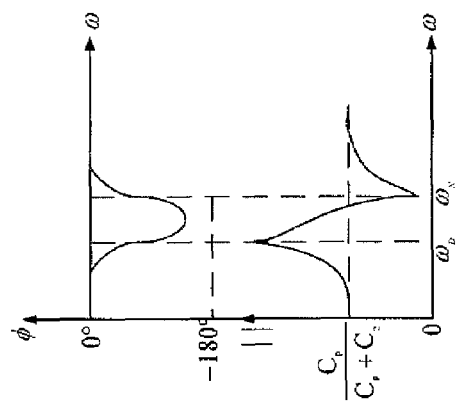
FIGS. 1A and 1B are diagrammatic and graphical plot representations of a resonator device model having a parallel, feedthrough capacitance.
Figure 1A:
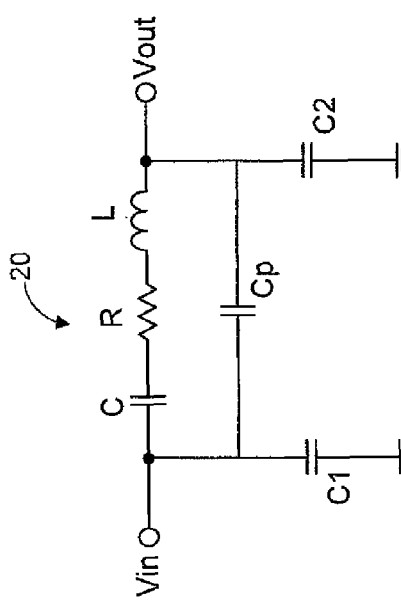

FIG. 1A illustrates a circuit model of a resonator-based device indicated generally at 20. The device 20 includes a MEMS resonator modeled by capacitive (C), resistive (R) and inductive (L) components arranged in series between an input node $V_{in}$ and an output node $V_{out}$. In this model, the resonator is connected at the input and output nodes to a circuit represented by two shunt capacitors, C1 and C2. A feedthrough capacitance $C_p$ interconnects the input and output nodes in a path parallel to the resonator components. The feedthrough capacitance $C_p$ may be referenced at times as a parallel capacitance for this reason. In this case, the feedthrough capacitance $C_p$ is modeled as a static capacitance, which may be generally representative of a resonant element not traveling the entire extent of the air gap, as well as other signal paths that connect the input and output nodes. These paths may pass through or otherwise involve the substrate, pads, bondwires, packaging, and a printed circuit board. For these reasons, the feedthrough capacitance $C_p$ may have a frequency-dependent component due to, for instance, substrate loss or bondwire inductance. Accordingly, compensation of this type of feedthrough capacitance may benefit from the utilization of another resonator of identical geometry and construction, as described below.

The device model of FIG. 1 exhibits the manner in which the operation of the device 20 is burdened by the feedthrough capacitance, $C_p$, despite the simplified nature of the circuit representation of the MEMS resonator. Generally speaking, portions of the input signals at the input node $V_{in}$ can bypass the resonator components (e.g., the time-varying capacitance or other transducer driving the output node) via the feedthrough path presented by the feedthrough capacitance $C_p$. FIG. 1B depicts the performance degradations resulting from the feedthrough path from the input node to the output node. The feedthrough level is not far below the resonant peak, and the phase characteristic has a dip that presents an undesirable degree of variability at or near the frequencies of interest. Both of these characteristics may result in a smaller oscillator circuit design margin, thereby affecting the overall stability during operation, especially in connection with varying environmental factors, such as temperature changes, voltage variations, and process variation. Specifically, the poor phase margin may allow the device 20, which may be, for instance, an oscillator circuit, to lock on a parasitic oscillation at a higher frequency than the desired resonant frequency.

The model of the resonator device 20 may be characterized by the following transfer function:

$$T(S) = \frac{\left(1 + \frac{C_p}{C}\right) + S^2 L' C_p}{\left(1 + \frac{C_p + C_2}{C}\right) + S^2 L'(C_p + C_2)}$$

Figure 2B:
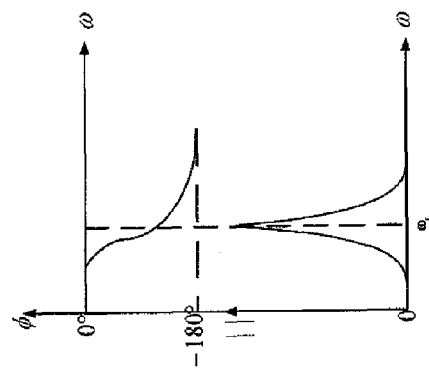
FIGS. 2A and 2B are diagrammatic and graphical plot representations of a resonator device model without a parallel, feedthrough capacitance.
Figure 2A:
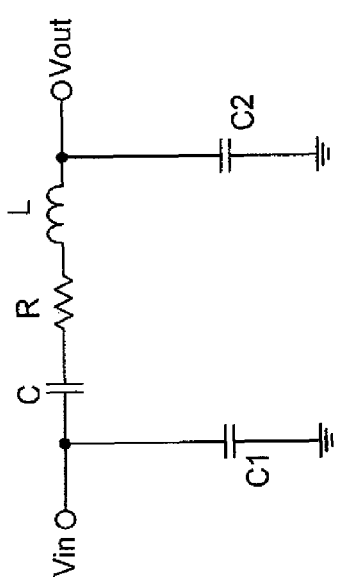

FIGS. 2A and 2B are directed to modeling a resonator-based device indicated generally at 22 and lacking a feedthrough capacitance $C_p$. The model of the device 22 is otherwise configured similarly to the model for the device 20 (FIG. 1), thereby providing a basis for comparing performance and response characteristics.

The absence of the feedthrough capacitance $C_p$ leads to the following transfer function and resonant frequency:

$$T(S) = \frac{1}{\left(1 + \frac{C_2}{C}\right) + S^2 L' C_2} \quad \omega_r = \frac{1}{\sqrt{L\left(\frac{C_2 C}{C_2 + C}\right)}}$$

A comparison of the response plots of FIGS. 1B and 2B exhibits the desirability of compensating for (e.g., cancelling or otherwise offsetting) the feedthrough capacitance $C_p$. Specifically, FIG. 2B depicts how the absence of the feedthrough capacitance leads to significantly lower feedthrough levels both near and removed from the resonant frequency. The resonator phase shift at resonance is also significantly improved, as the phase curve of FIG. 2B does not include the undesirable dip shown in FIG. 1B. The smoother and flatter nature of the phase curve for the resonator device 22 may also lead to lower phase noise and an improved noise floor for an oscillator device.

The performance improvements arising from the compensation of the feedthrough capacitance $C_p$ from the resonator device model will now be described in connection with a number of exemplary embodiments. The exemplary embodiments described below involve compensation techniques for MEMS resonators. The feedthrough capacitance of MEMS resonators has the potential, if left uncompensated or unaddressed, to complicate their widespread utilization. For instance, the feedthrough capacitance may present a limiting factor by prohibiting resonators from being used for higher frequency applications, limiting the allowable stiffness of the resonators, requiring very thin gaps, requiring large bias voltages, and trading off many design parameters to provide better power handling.

These and other undesirable effects of the feedthrough capacitance can be compounded in applications involving an array of resonators connected in parallel. In these and other cases, the feedthrough capacitances of multiple resonators can affect the performance of a single resonator in the array, as the feedthrough capacitance of each resonator in the array is connected in parallel with the affected device. Moreover, the performance degradation would occur regardless of whether the other resonators in the array are biased or otherwise activated for operation.

The disclosed techniques and devices are thus well-suited for a variety of resonator device contexts. For example, the disclosed techniques may be directed to improving the performance of single-resonator devices (i.e., devices having a single resonator) as well as resonator arrays. Despite the advantages of addressing the feedthrough capacitance presented by MEMS resonators, the disclosed techniques and circuit designs are not limited to a particular type or source of feedthrough capacitance. Generally speaking, the nature or underlying source of the feedthrough capacitance is not germane to the disclosed techniques and circuit designs. The disclosed techniques and circuit designs may therefore be applied to offset a variety of different types of feedthrough capacitances.

Figure 3:
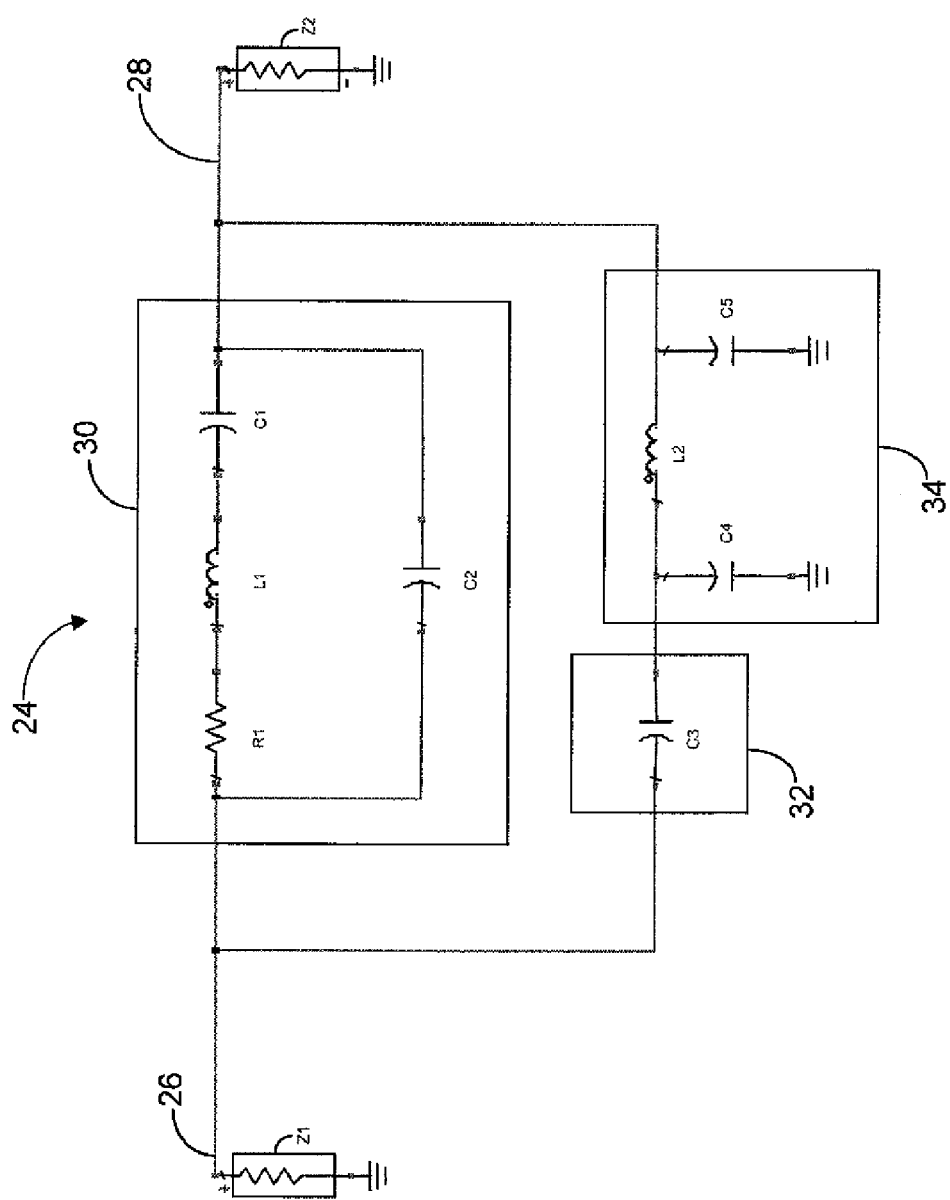
FIG. 3 is a circuit diagram of a device configured to implement a passive feedthrough capacitance compensation technique for a single MEMS resonator, the technique involving a compensation capacitance and a phase inverter arranged in accordance with an exemplary embodiment.

Passive Compensation—LC Network Inversion. With reference now to FIG. 3, a passive technique for cancelling, offsetting or compensating for the feedthrough capacitance $C_p$ is shown in connection with a device indicated generally at 24. In some cases, the device 24 may form part of an oscillator or other resonator-based device. Generally speaking, the technique utilizes a compensation path disposed between an input node 26 and an output node 28. The compensation path is directed to offsetting the effects of the feedthrough capacitance $C_p$ of a MEMS resonator 30 coupled to the input and output nodes 26 and 28. The feedthrough capacitance $C_p$ is represented, or modeled, by a capacitor C2 disposed in a bypass path effectively formed or presented around the time-varying capacitance or other transducer of the resonator 30. In this way, the bypass path formed by the feedthrough capacitance $C_p$ couples the input node 26 to the output node 28, thereby allowing a spurious signal to reach the output node 28.

The compensation path of this exemplary embodiment is connected in parallel with the resonator 30 and, thus, in parallel with the bypass path, to offset the spurious signal. The compensation path includes a compensation capacitor or capacitance 32 followed by a phase inversion circuit 34 configured to provide a 180 degree phase shift. Generally speaking, the compensation capacitance 32 is driven by the input signal in a manner that mimics the effects of the feedthrough capacitance $C_p$. The output of the compensation capacitance 32 is then provided to the phase inversion circuit 34 to generate a compensation signal. The compensation signal is thus 180 degrees out of phase from the spurious signal for offsetting combination at the output node 28.

Further details regarding the operation of the exemplary embodiment of FIG. 3 are now provided. A steady-state, time-varying input signal is provided at the input node 26, a typical context for oscillator and filter applications. The input signal is generated from a circuit generally having an input impedance Z1 before being provided to drive the resonator 30 and the compensation capacitance 32. The input signal is then distributed between two parallel paths to the output node 28. One path proceeds through the resonator 24, while the second path corresponds with the compensation path, which, in this case, includes a capacitor C3 as the compensation capacitance 32 and the component(s) of the phase inversion circuit 34. Generally speaking, the capacitor C3 and, more broadly, the compensation capacitance 32, are configured such that the input signal is presented with two paths with capacitances that are roughly in balance. In an ideal case, the paths are balanced exactly, such that the feedthrough capacitor C2 and the compensation capacitance 32 have the same effect on the input signal. The only difference is then that the signal proceeding through the compensation path is also inverted by the phase inversion circuit 34. The non-inverted and inverted signals from the two parallel paths are therefore identical but 180 degrees out of phase. Combining the two signals at the output node 28 then exactly cancels the effects of the feedthrough capacitance.

In this case, the phase of the signal is shifted 180 degrees by a set or network of passive, lumped-element components, including a capacitor C4, an inductor L2, and a capacitor C5. Although the capacitances and inductance provided by the phase inversion circuit 34 may be provided via a variety of components, the capacitor C4 may have a capacitance of 700 pF, the inductor L2 may have an inductance of 220 nH, and the capacitor C5 may have a capacitance of 700 pF, in this exemplary case. More generally, the 180 degree phase shift provided by the phase inversion circuit 34 may be implemented in a variety of ways. For instance, the phase inversion circuit 34 may include a standalone, off-the-shelf component or, alternatively, be implemented via a number of customized elements. Any 180 degree phase shifter may be utilized.

The feedthrough capacitance of a MEMS resonator can, in fact, largely be static, as described above. The capacitor C3 and, more generally, the compensation capacitance 32, may accordingly be a fixed capacitance. For example, the compensation capacitance 32 may include one or more capacitive elements having a variety of fixed configurations, including, for instance, polysilicon/silicon dioxide/polysilicon structures that form a parallel plate capacitor.

Despite the ideal goal of balancing the two paths exactly, the passive compensation embodiment of FIG. 3 incorporates a predetermined mismatch that may result in slightly unmatched paths. The mismatch may generally help avoid overcompensation that can arise from processing or other variations. For example, processing variations or operational conditions can result in a changed or unexpected effective feedthrough capacitance. Such variations may arise from a variety of sources, including, without limitation, variations in gap thicknesses among devices, variations in substrate conductivity, variations in device packaging, and component tolerances in the phase shifting network. The resulting overcompensation may result in stability issues arising from an undesirable phase shift at resonance.

In this exemplary case, a capacitor C3 of the compensation capacitance 32 may be selected such that a total capacitance presented by the compensation path remains a certain amount below an average or expected feedthrough capacitance for the type of resonator involved. For example, the mismatch amount may be predetermined or selected based on an acceptable amount (in dB) of feedthrough, or as a relative percentage of the average or expected feedthrough capacitance. Alternatively or additionally, the intentional mismatch may be determined in accordance with the standard deviation of the feedthrough capacitances presented by the type of resonator involved. The mismatch may alternatively be selected after a measurement or other determination of the feedthrough capacitance, in which case one or more capacitors or capacitances in the compensation path may be tuned to reach the desired mismatch.

More generally, a predetermined or selected mismatch as described above can improve performance by compensating for the bulk (e.g., a substantial amount) of the feedthrough capacitance. For example, the mismatch may be predetermined to result in near perfect cancellation, while still leaving room for foreseeable processing or operational fluctuations.

Some cases may involve relatively large variation in the feedthrough capacitance. The feedthrough capacitance may vary considerably for a variety of reasons either during operation (e.g., operational temperature) or as a result of processing variation. To address these sources of large variation, the capacitor C3 or some other component of the compensation capacitance 32 may include a variable or tunable capacitor to make small adjustments to a base or foundation capacitance. In some cases, an adjacent, but unbiased (i.e., inactive), MEMS resonator may be used to provide or set the foundation amount of the compensation capacitance 32. An identical, released resonator may be more convenient to design and configure for the above-described near perfect cancellation. Use of another MEMS resonator may provide a convenient mechanism for a rough match that is insensitive to wafer-to-wafer processing variations or flaws. The rough match may then be tailored or fine-tuned with one or more capacitors or capacitances disposed in either path. The tuning capacitors or capacitances may also be disposed in either path to establish a desired or predetermined mismatch, as described above.

The above-described predetermined mismatch approach to feedthrough capacitance compensation may be applied to any of the embodiments described herein.

The compensation technique implemented in connection with the device 24 is compatible with a variety of resonators. The MEMS resonator 30 is not limited to any particular resonant structure or design, and is depicted as a series of lumped elements for purposes of illustration. Similarly, the feedthrough or bypass path is shown with the capacitor C2 connected as shown for purposes of illustration. In one example, the MEMS resonator 30 includes a resonant beam configured as described in U.S. Pat. No. 6,930,569, the disclosure of which is hereby incorporated by reference. More generally, the MEMS resonator 30 may include a resonant structure configured for operation in any desired resonant mode and at any desired resonant frequency. Indeed, practice of the disclosed techniques generally broadens the range of MEMS resonator designs suitable for various applications, as the compensation capacitance eases, if not eliminates, a number of design restrictions related to, for instance, structure stiffness, bias voltage, and gap size.

Figure 4:
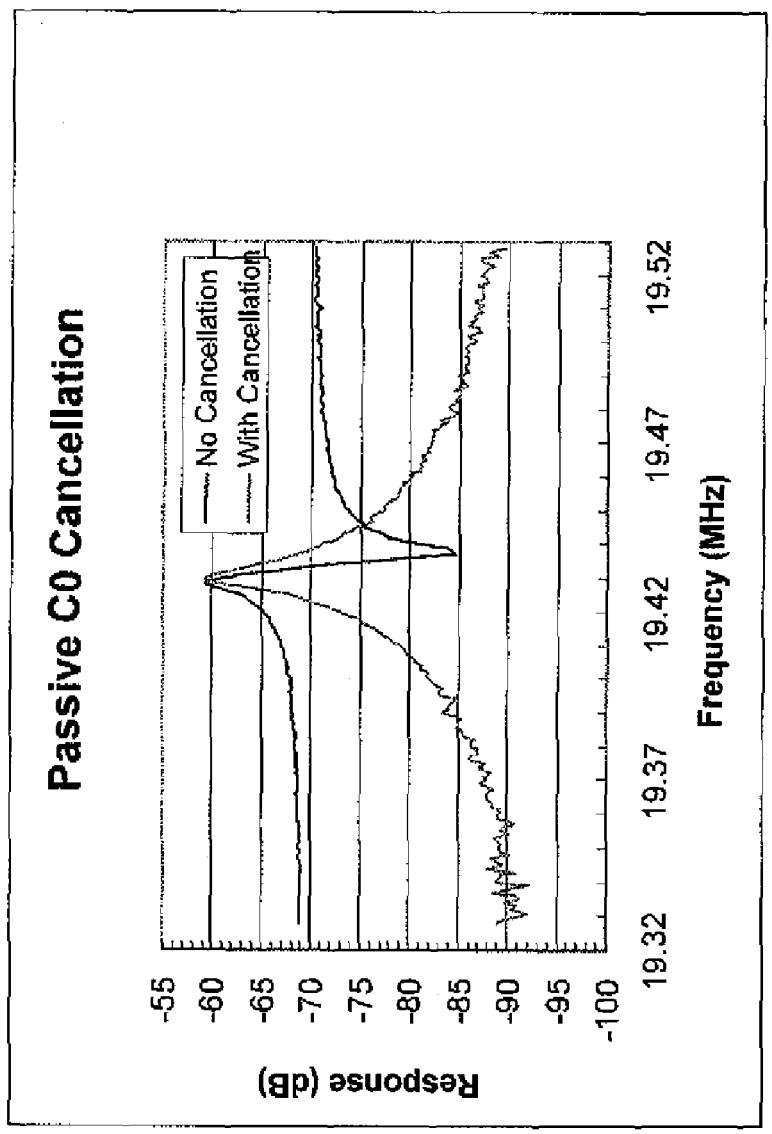
FIG. 4 is a frequency response plot depicting the operation of the MEMS resonator of FIG. 3 both with and without feedthrough capacitance compensation.

The compensation technique implemented in connection with the device 24 of FIG. 3 has been tested with a 19 MHz MEMS resonator constructed in accordance with the teachings of the above-referenced patent. The performance of the device 24 was measured using a vacuum probe station and compared with the performance of the 19 MHz resonator alone (i.e., without compensation). For compensation, the phase inversion circuit 34 of the device 24 was implemented using a small daughter-board of surface mount components tuned for 19.4 MHz (see, e.g., the component values identified above). As shown in FIG. 4, the performance comparison reveals that the uncompensated resonator operated with a feedthrough level that was only 9 dB below the resonator peak level. In an oscillator application, such performance would translate to an increased noise floor and poor phase margin. In comparison, the compensation provided via the operation of the device 24 improved the resonator performance by decreasing the feedthrough level over 20 dB.

Passive Compensation—Transformer Inversion. The inverted compensation signal can be generated by a variety of different circuit designs. The exemplary technique described in connection with FIGS. 3 and 4 uses an LC phase shifter to generate the inverted signal. A potentially more accurate, broadband method may be achieved using either a transformer or a differential amplifier. The former approach provides another passive compensation technique and is described in connection with FIGS. 5-9. Active, amplifier-based compensation techniques are described in connection with FIGS. 10-16. Both the passive and active compensation techniques may be applied to devices having any number of resonators disposed in parallel, in which each device is selected for operation or activated via the application of a bias, or polarization, voltage (Vp). Further information regarding activation or bias voltages may be found, for instance, in the above-referenced patent.

Figure 5:
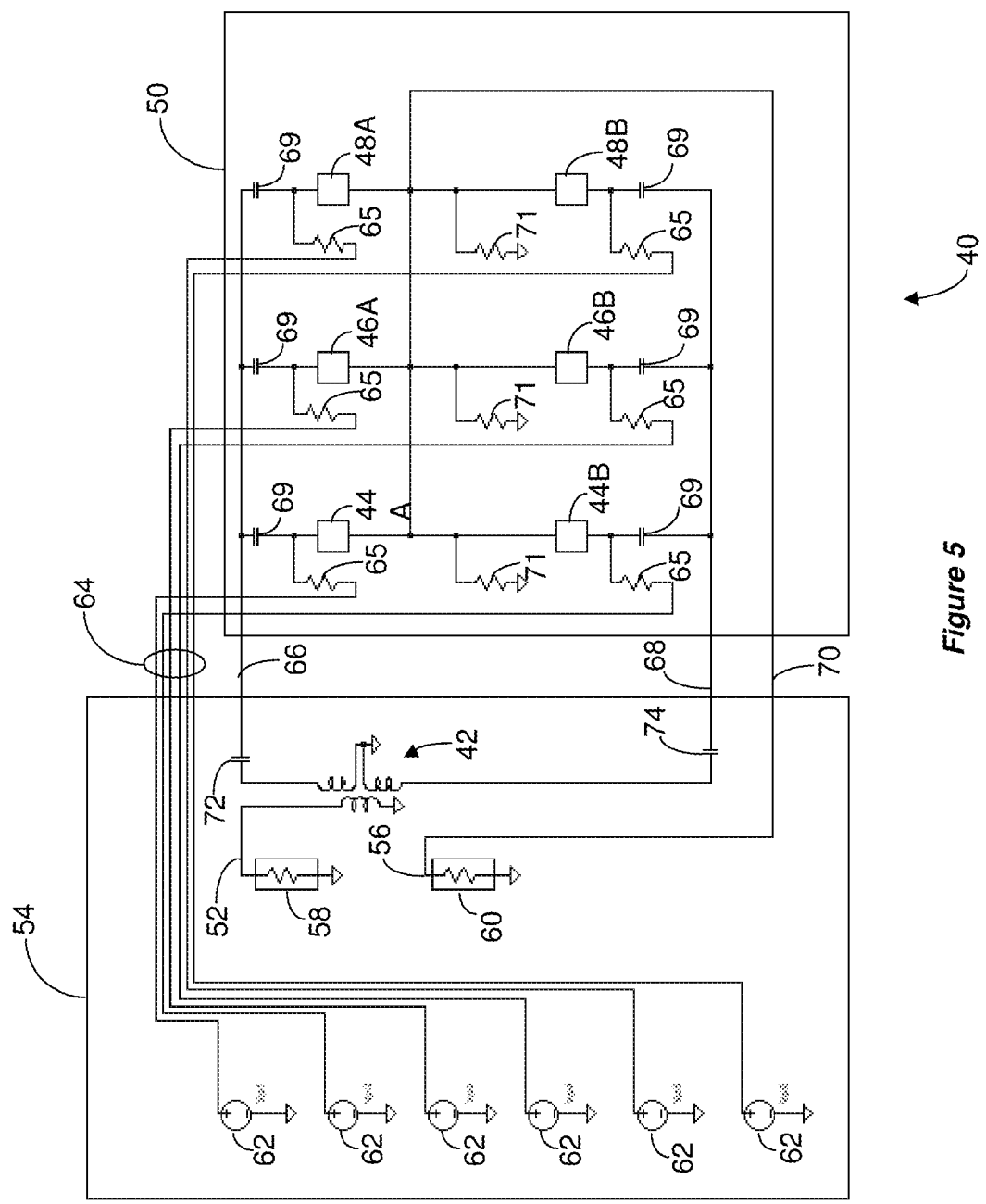
FIG. 5 is a circuit diagram of a device configured to implement another passive feedthrough capacitance compensation technique for an array of MEMS resonators connected in a multiple-channel arrangement, the technique involving a center-tapped transformer arranged in accordance with another exemplary embodiment.

Turning to FIG. 5, an exemplary transformer-based compensation technique is described in connection with a device indicated generally at 40. The device 40 may be useful in a variety of applications involving, for instance, oscillator or filter functionality. The device 40 includes a center-tapped transformer indicated generally at 42 to generate in-phase and inverted signals for an array of MEMS resonators. In this example, the in-phase signal is provided to drive a set of three resonators 44A, 46A and 48A, and the inverted signal is provided to drive a companion set of three resonators 44B, 46B, and 48B. Taken together, the two sets of resonators provide a configuration in which any one or more of six resonators may be selectively activated and driven at a given time. More specifically, the resonators 44A and 44B correspond with a first companion pair of resonators, one of which can be activated, while the other provides a compensation signal for the feedthrough capacitance compensation. Second and third companion pairs are provided with the resonators 46A and 46B, and the resonators 48A and 48B, respectively.

The six resonator array may be disposed and arranged on a board or chip 50 with similar input/output connectivity in the interest in balancing the in-phase and out-of-phase paths. Moreover, each pair of companion resonators (e.g., 44A and 44B, 46A and 46B, etc.) may be fabricated together to nullify manufacturing-based variations. The entire array, in fact, may be manufactured on a single wafer in the same fabrication run. The total number of resonators in the array was limited only for purposes of ease in illustration. In fact, the implementation of this transformer-based compensation technique was simulated in connection with the operation of over 20 devices with good performance results. Without the compensation techniques described below, arrangements having similar numbers of resonators can exhibit unacceptable levels of feedthrough arising from the cumulative effects of the resonator array.

In operation, an input drive signal is fed into the center-tapped transformer 42 from an input terminal 52, which may be disposed on an input/output or control board 54 separate from the chip 50. The control board 54 also includes an output terminal 56 for accessing an output sense signal generated from the resonator array. The input and output terminals 52 and 56 may have impedances 58 and 60 (e.g., 50 Ohms), respectively arising from circuitry coupled thereto. In addition to driving and sensing the operation of the resonator array, the control board 54 may also include a corresponding number of voltage sources 62 for the bias or activation voltages $V_{p1}$-$V_{p6}$ of the resonators. Alternatively, the control board 54 may include a corresponding number of terminals to receive the activation voltages. The activation voltages may be selectively provided to the resonator array via a DC wire harness 64 and respective current-limiting resistors 65 (e.g., 1 MOhm) connected as shown to a drive or input node of the resonator as shown or, alternatively, to the sense or output node. The resistors 65 may provide isolation from any analog component of the bias or activation voltages. The in-phase and inverted signals from the transformer 42 may be provided to the input nodes of the resonator array via, for instance, coaxial cables 66, 68 and DC blocking capacitors 69 having a capacitance of, e.g., 10 nF.

In this exemplary embodiment, the phase inversion circuitry of the compensation path generally includes and corresponds with the center-tapped transformer 42, specifically the inverting portion thereof. Thus, the inverted compensation signal is generated by the transformer 42, which may be, for example, a surface-mount transformer such as Mini-Circuits Model No. ADT1-6T Brooklyn, N.Y.). The surface-mount transformer generally has good phase balance (e.g., a phase imbalance of better than 1 degree) and good amplitude balance (e.g., an amplitude balance of better than 0.1 dB). In this example, the surface-mount transformer has an impedance ratio of 1, an insertion loss of less than 1 dB, and a frequency range of 30 kHz to 125 MHz, although these specifications may vary considerably.

With the transformer 42 coupled to the input terminal 52, the input signal is processed or inverted before encountering the compensation capacitance (as opposed to the arrangement of FIG. 3). Specifically, the outputs of the transformer 42 on the cables 66, 68 are both 0 and 180 degrees referenced to the input drive signal from the terminal 52, respectively. As a result, the output signals resulting from the drive signal carried by the cables 66 still acts as a compensation signal for the output signals resulting from the drive signal carried by the cables 68, and vice versa. Moreover, the compensation capacitances and the respective compensation signals are provided regardless of whether the resonator pair has an activated resonator.

The feedthrough capacitances of each companion pair of resonators generally offset each other. In the exemplary embodiment of FIG. 5, the resonant structures of the resonator array provide most, if not all, of the compensation capacitance. However, other portions of the circuit may provide a portion of the compensation capacitance. Generally speaking, the compensation capacitance in this embodiment includes any capacitance provided along the compensation path between the transformer 42 and the output terminal 56. Specifically, the compensation capacitance may also include the capacitance provided via the coaxial cables 66, 68 and other component(s) leading thereto, such as one of the piston capacitors 72, 74.

The output of the resonator array is taken as a common output and may be fed back via a line 70 coupled to the output sense terminal 56. To bias the output (or sense) side of each resonator, each connection between a companion pair of resonators and the common output line 70 may be grounded by a resistor 71 (e.g., 1 MOhm). In this way, the overall potential drop across each resonator is maintained at the DC bias voltage (e.g., 2.5 V) Notwithstanding the foregoing, other output arrangements are compatible with the disclosed compensation techniques as well, including, for instance, those that involve multiple output nodes.

The outputs of the transformer 42 may be coupled to the cables 66, 68 by a trimmable piston capacitor 72, 74 for balancing the transformer output lines to a desired extent. In one example, the phases of the two output lines are balanced at 0 and 180 degrees by the piston capacitors 72, 74. The piston capacitors 72, 74 may alternatively or additionally be utilized to address large unbalances due to, for instance, a missing or ineffective resonator. The piston capacitors 72, 74 may still further be used to introduce a desired, slight mismatch to protect against overcompensation. Each piston capacitor 72, 74 may be, for example, a dielectric trimmer capacitor such as Voltronics Model No. 20A-J-25HV Denville, N.J.), which has a trim range of less than 1 pF to about 30 pF. After any desired tuning, the in-phase and inverted signals are then fed into two different path legs of the resonator array, the first path leg having parallel paths for the resonators 44A, 46A and 48A, and the second path having parallel paths for the resonators 44B, 46B, and 48B.

In one example, the above-identified components of the device 40 may have the following component values, it being understood that the values are exemplary in nature and may vary considerably while still embodying the disclosed device:

| | |
|---|---|
| Resistors 65 | 1 MOhm |
| Capacitors 69 | 10 nF |
| Resistors 71 | 1 MOhm |
| Capacitor 72 | 2 pF |
| Capacitor 74 | 20 pF |
| Bias Voltages Vp1-Vp6 | 2.5 V |

Figure 7:
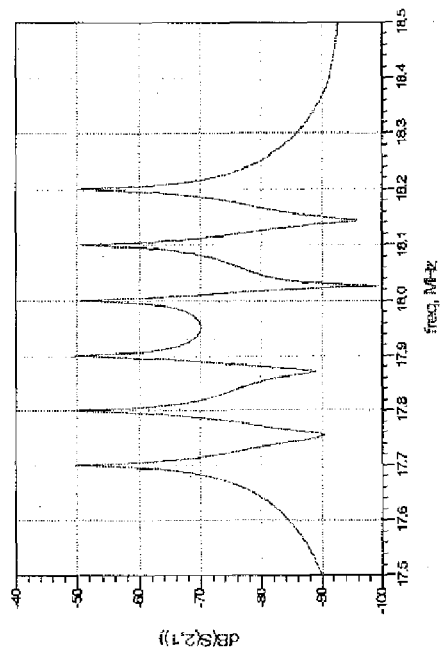
FIG. 7 is a frequency response plot depicting the operation of the array of MEMS resonators of FIG. 5 with all of the resonators activated.
Figure 6:
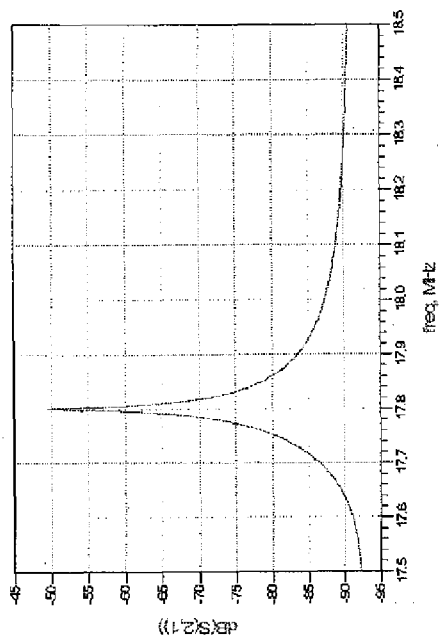
FIG. 6 is a frequency response plot depicting the operation of the array of MEMS resonators of FIG. 5 with only a single resonator activated.

An example of the device 40 of FIG. 5 was configured for simulation and testing as a six channel circuit. Each resonator was accordingly configured to resonate at a slightly different frequency. FIGS. 6 and 7 depict plots of the output signal captured by a network analyzer (not shown) coupled to the output terminal 56. Specifically, FIG. 6 is a plot of a single resonator (e.g., the resonator 44A) activated via a respective DC bias voltage provided from one of the power sources 62 (FIG. 5). The companion resonator (e.g., the resonator 44B) provides the compensation capacitance, and the remaining two resonator pairs are effectively self-compensating. That is, the feedthrough capacitances of the remaining, non-activated devices in the array (the resonator pair 46A and 46B and the resonator pair 48A and 48B) offset each other, cancelled out by the symmetry of the array. In this case, a very low feedthrough level is attained, and the peak stays at a roughly normal level of −48 dB. Such improved performance is available despite the parallel configuration of the array. In fact, the feedthrough level is far below the −60 dB level typically attained for the resonator when arranged as a single device, showing that the feedthrough capacitance of the active resonator is indeed being offset via the compensation capacitance provided by its companion resonator.

FIG. 7 shows the simulated response if all six devices are activated at once. The feedthrough capacitances of the resonator pairs again offset each other, leading to low feedthrough. The resonators were configured in the simulation to have resonant frequencies offset 100 kHz apart from each other for ease in differentiating the operation of the individual resonators. This condition may be realized by activating and driving all the resonators at once, which may be similar to, for instance, an initial burn-in of the resonators, at which point each of the resonators is at a different frequency.

Another exemplary device involved a parallel array of 18 resonators. The resonators were arranged in nine companion pairs in a manner similar to that described above in connection with the embodiment of FIG. 5. In this case, a 1:1 center tapped surface mount transformer was used to generate the in-phase and inverted signals. The resonators were selected at random for use in this example. During the testing, no additional trimming or compensation was used to balance the legs. Each resonator was biased independently through an on-board bias network similar to that shown in FIG. 5.

Figure 8:
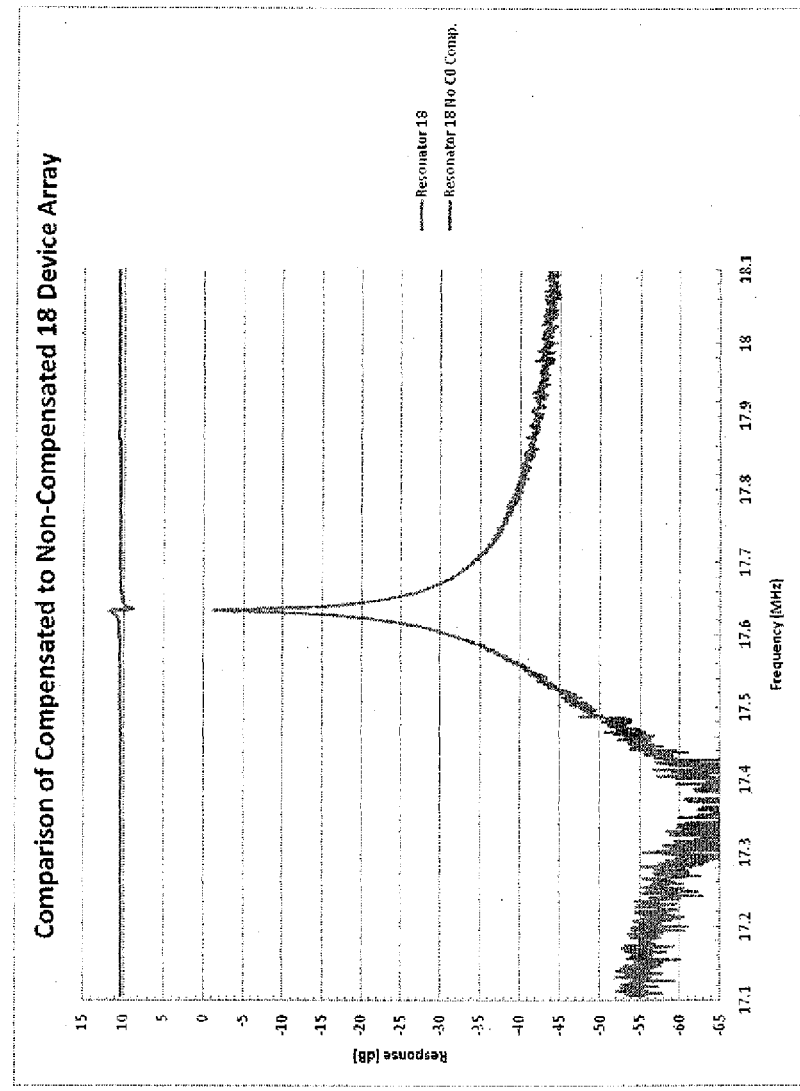
FIG. 8 is a frequency response plot depicting the activation and operation of a single resonator of an exemplary 18-resonator array both with and without implementation of the passive feedthrough capacitance compensation technique illustrated in FIG. 5.

FIG. 8 depicts the measured response for a single biased resonator of the array of 18 resonators after placement on a test board. The measurements were taken using an Agilent 8753 network analyzer with an external transimpedance amplifier to boost the signal-to-noise ratio above the instrumentation noise floor. The gain of the amplifier was approximately 46 dB. The frequency response of the 18 resonator board for a single activated resonator is shown both with and without feedthrough capacitance compensation. The results show that the peak-to-feedthrough ratio improves from 2 dB to approximately 45 dB for the array of 18 devices. Further compensation and, thus, an even better ratio, can be obtained through the use of tuning capacitors. While the device exhibits much lower insertion loss without cancellation, this is primarily due to the very low loss path through the uncompensated feedthrough capacitances presented by the rest of the resonator array.

Figure 9:
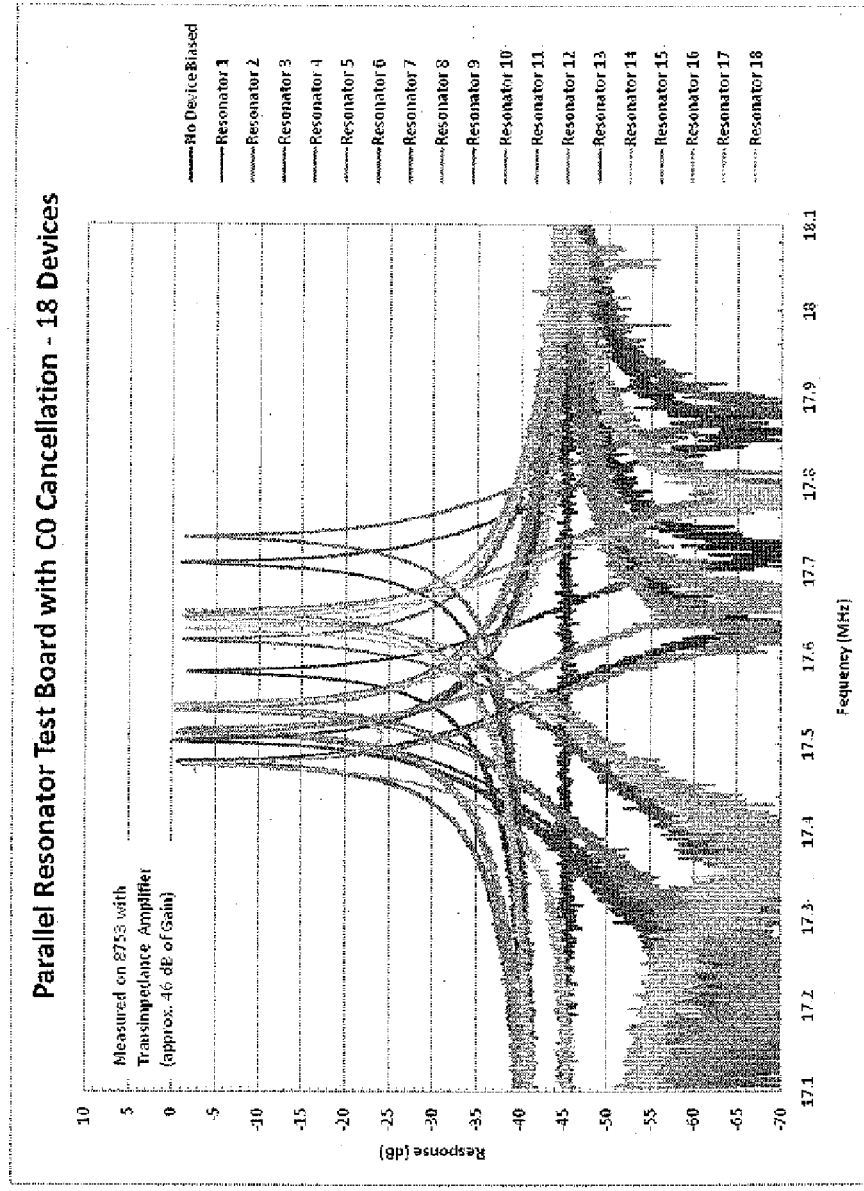
FIG. 9 is a frequency response plot depicting the activation and operation of all 18 resonators of the exemplary 18-resonator array during implementation of the passive feedthrough capacitance compensation technique illustrated in FIG. 5.

FIG. 9 depicts the results of testing the device as each resonator was individually biased through the on-board biasing network. In this case, the compensation path did not include any tuning capacitors. Fine tuning the compensation capacitance may not be necessary, as the resonator pairs may be largely self-compensating. However, the feedthrough level can be improved by approximately 10 dB by adding an external tuner (e.g., an external tuning capacitance, such as a piston capacitor) in the compensation path.

Based on the results shown in FIGS. 8 and 9, the use of compensation capacitance expands the range of suitable arrays, which is by no means limited to 18 devices. The resonator array may, for instance, be expanded until the typical peak-to-feedthrough ratio of an individual, uncompensated resonator of approximately 15 dB is reached. The array size may be as high as 100 resonators without external capacitance tuning, and potentially several hundred devices with such capacitance tuning, depending on the quality and capacity of the transformer.

Active Compensation—Differential Amplifier Inversion. The resonator feedthrough capacitance can be offset actively using, for example, a differential amplifier to generate the compensation signal. Active compensation may be useful in providing frequency performance and design flexibility advantages. In accordance with this aspect of the disclosure, the feedthrough capacitance compensation is implemented with one or more active components arranged with offsetting feedback loops or paths.

A variety of different active components and feedback configurations may be utilized, several of which are addressed below. In some cases, the differential nature of the amplifier feedback configuration involves a differential input scheme, in others, a differential output scheme. For example, a differential input scheme may have a pair of feedback paths separately driving non-inverting and inverting input terminals of the amplifier. In contrast, the feedback paths of a differential output scheme may involve complementary output terminals of the amplifier driving feedback paths connected to the same input terminal. More generally, one feedback path contains and drives the resonator, while another feedback path contains and drives the capacitor(s) or capacitance(s) that together provide the compensation capacitance. The feedback paths are then balanced or otherwise configured to offset the feedthrough capacitance of the resonator to a desired extent.

Two exemplary embodiments involving a fully differential amplifier are now described in connection with FIGS. 10 and 11. In these cases, the use of a fully differential amplifier facilitates the balancing of a pair of feedback paths. More generally, a fully differential amplifier may be arranged in a configuration with more than one pair of feedback paths for the compensation of more than one resonator.

With reference now to FIG. 10, a device indicated generally at 100 includes a fully differential amplifier 102 arranged in a circuit configuration having a pair of feedback paths. A first feedback path 104 includes a resonator 106 that couples a non-inverting output 108 to a non-inverting input 110. A second feedback path 112 includes a compensation capacitance $C_0$ that couples the non-inverting output 108 to an inverting input 114. The non-inverting input 110 and the inverting input 114 present the input voltages $V_{IN}^+$ and $V_{IN}^-$ of the amplifier 102 for the determination of an output voltage $V_o$ at the non-inverting output 108. An unconnected (or dummy) pad 116 is coupled to an inverting output 118 of the amplifier 102 for balancing the capacitance associated with a pad (not shown) coupled to the non-inverting output 108 for access to the output voltage $V_o$.

A number of commercially available amplifiers are suitable for use as the amplifier 102. In alternative cases, the amplifier 102 is coupled to one or more additional amplification stages, in which case the device specifications may differ from the single-amplifier context accordingly.

In operation, the compensation capacitance $C_0$ of the device 100 offsets the feedthrough capacitance of the resonator 106 as follows. Those portions of the input drive signal allowed to bypass or pass through the resonator 106 via the feedthrough capacitance also reach the compensation capacitance $C_0$ via the non-inverting output terminal 108. The signal portions accordingly pass through the compensation capacitance $C_0$ as well, reaching the inverting input 114 of the differential amplifier 102. Generally speaking, the contributions at the two input nodes offset each other due to the nature of the differential input scheme. In an exemplary case, the compensation capacitance $C_0$ is set equal to the feedthrough capacitance such that the resonator admittance may be expressed as $Y_x+SC_0$ (see the model depicted in FIG. 1A), and such that:

$$\frac{V_{in}^+ - V_{in}^-}{V_o} = \left[\frac{Y_x}{Y_x + Y_{in} + sC_o}\right]\left[\frac{Y_{in}}{Y_{in} + sC_o}\right]$$

Away from resonance, the admittance $Y_x$ goes to zero, and perfect loop gain cancellation is therefore achieved as follows:

$$Y_x \to 0 \Longrightarrow \left[\frac{V_{in}^+ - V_{in}^-}{V_o}\right] \to 0$$

It may be useful to set $sC_0 \ll Y_{in}$, as a finite phase shift is added even at resonance. In such cases, the foregoing expression for the exemplary implementation of FIG. 10 simplifies to approximate the response of a resonator free of a feedthrough capacitance as follows:

$$sC_o \ll Y_{in}$$

$$\frac{V_{in}^+ - V_{in}^-}{V_o} \approx \left[\frac{Y_x}{Y_x + Y_{in}}\right]$$

Turning now to FIG. 11, a device indicated generally at 120 implements an active compensation technique utilizing a feedback configuration that implements a differential output scheme. A resonator 122 is coupled to a fully differential amplifier 124 and a first feedback path 126, while a second feedback path 128 includes the compensation capacitance $C_o$. Specifically, the first feedback path 126 couples a non-inverting output 130 of the amplifier 124 to a non-inverting input 132 of the amplifier 124. The second feedback path 128 is also coupled to the non-inverting input 132 of the amplifier 124, while being driven by, and coupled to, an inverting output 134 of the amplifier 124. In this arrangement, the inverting input of the amplifier 124 is tied to ground (see FIG. 12C for an alternative configuration involving an unconnected pad).

To offset those portions of the input signal $V_{in}$ passing through the feedthrough capacitance, $C_p$, the feedback paths 126 and 128 for the differential amplifier 124 are configured such that:

$$(V_o^+ - V_{in})sC_p = -(V_o^- - V_{in})sC_o$$

i.e., with $C_p = C_o$, $$V_o - V_{in} = V_o + V_{in} \Longrightarrow V_{in} \to 0$$

or $$V_{in} \ll V_o$$

But $$V_o = A_{SE}V_{in}$$

$\Rightarrow A_{SE} \gg 1$

As shown above, a large open loop gain (ASE>>1) may be useful to achieve the desired compensation. In many cases, the same commercially available amplifier may be used in the embodiments of FIGS. 10 and 11 as the amplifier 102 or the amplifier 124.

In each of the embodiments of FIGS. 10 and 11, the compensation capacitance $C_O$ may include any number of capacitors or capacitances that, in combination, offset the feedthrough capacitance. For example, the compensation capacitance $C_O$ may include a single capacitor supplemented by the capacitance inherent in the compensating feedback path in which the capacitor is arranged.

Alternatively, the devices 100 and 120 of FIGS. 10 and 11, respectively, may be configured such that the compensation capacitance $C_O$ does not exactly equal or match the resonator feedthrough capacitance. In these cases, the total capacitance of any capacitors or capacitances arranged in the compensating feedback path remains less than the feedthrough capacitance to minimize or avoid the possibility of overcompensation.

FIGS. 12A and 12B illustrate the devices 100 and 120 of FIGS. 10 and 11, respectively, to identify a manner in which the corresponding compensation techniques may benefit from capacitance matching (or balancing) considerations. Generally speaking, matching the capacitances of certain branches or portions of the two feedback paths may facilitate compensation to a desired extent. These considerations may take into account the intrinsic or parasitic capacitances of each branch, as well as utilize tuning capacitors, as desired.

The feedback path branches pertinent to impedance matching differ depending on the feedback arrangement of the compensation technique. The pertinent portions of the feedback paths are identified in FIGS. 12A and 12B via bolding, while other components of the devices 100 and 120 are identified with the reference numerals discussed above in connection with FIGS. 10 and 11. The pertinent portions of the feedback paths generally follow the nature of the compensation technique. For instance, the pertinent portions of the feedback paths 104 and 112 in FIG. 12A are on the input side of the amplifier 102. Specifically, balancing the capacitances of input branches 136 and 138 of the feedback paths 104 and 112, respectively, may be useful in implementing the embodiment of FIGS. 10 and 12A. Similarly, balancing the capacitances of output branches 140 and 142 of the feedback paths 126 and 128, respectively, may be useful in implementing the embodiment of FIGS. 11 and 12B. In some cases, the feedback paths may nonetheless present an overall mismatch or offset when aggregated over the entire feedback path.

In some cases, it may useful to maintain a true differential signal by tapping at the inverting output rather than disturbing the differential nature of the structure by tapping somewhere else. This may generally allow the output signal to be split actively with minimum parasitic elements added, such as pad capacitances, etc. In these and other cases, it may also be possible and desirable to add matching elements to both feedback paths to maintain a true differential, balanced signal. For instance, the addition of a capacitive element, such as shunt capacitance, may give rise to matching considerations. Despite these attempts to provide a balanced, feedback-based approach to generating a 180 degree phase shift, the compensation capacitance may still present a mismatch with respect to the feedthrough capacitance.

FIGS. 13A and 13B provide the results of a simulation of the compensation technique and device shown in FIG. 10, while FIGS. 14A and 14B provide the results of a simulation of the compensation technique and device shown in FIG. 11. The triangle-shaped data points in FIGS. 13A and 13B represent the operation of the resonator without compensation, while the application of the compensation technique is represented by the square-shaped data points. In FIGS. 14A and 14B, the triangle-shaped data points depict compensated operation, while the rectangular data points depict uncompensated operation. The simulation shown in FIGS. 14A and 14B involved partial compensation via a smaller value of the compensation capacitance $C_0$, which may be useful in avoiding overcompensation due to process variations or other changes. One result of the partial compensation is depicted in the phase curve shown in FIG. 14B.

FIGS. 15 and 16 depict further examples of active compensation that, in some ways, implement techniques similar to those described and shown in connection with FIGS. 10 and 11, respectively. One difference in the techniques, however, involves multiple-stage amplification. Generally speaking, the multiple amplifier stages provide multiple opportunities for tuning or balancing, as well as for greater flexibility in gain control. For example, the stages may be directed to different resolution levels, ranging from coarse to fine tuning as to phase as well as gain.

With reference now to FIG. 15, a device indicated generally at 150 includes four amplification stages, each of which is based on a fully differential amplifier. In this exemplary case, the first three amplifier stages are gain stages, while the fourth stage is an amplitude-limiting stage. A resonator 152 and a compensation capacitance $C_0$ are arranged in first and second feedback paths 154 and 156, respectively, coupling the fourth and final amplification stage to the first amplification stage in a differential input configuration. More specifically, an input node or terminal 158 is coupled to an output node or terminal 160 via the feedback path 154. In this case, the feedback path 156 couples the output node 160 to another input node 162. Each of the aforementioned input and output nodes, as well as an unconnected node 163 may be connected to similarly configured pads (not shown) in the interest of balancing or matching capacitances. The input node 158 may also be coupled to a DC bias as shown for activation of the resonator 152. Again, in the interest of balancing the device 150, a similar DC bias connection may be provided for the input node 162.

A first amplifier stage indicated generally at 164 includes a phase shifter 166 coupled and leading to both inputs of a fully differential amplifier 168. In this exemplary case, the first amplifier stage 164 may be directed to removing a spurious resonant mode that may be introduced by the resonant element. A fully differential amplifier 170 of the second amplifier stage is coupled to the output terminals of the amplifier 168 in a manner to invert the output thereof. A tunable phase shifter 172 couples the output of the amplifier 170 to the third amplifier stage, which includes a fully differential amplifier 174. The phase shifter 172 may generally facilitate the compensation of the feedthrough capacitance through either coarse or fine tuning of either feedback path. To that end, the phase shifter 172 includes a pair of variable resistors 176 coupling respective capacitors 178 to a DC bias. A further tunable phase shifter 180 couples the amplifier 174 to an amplifier 182 of the fourth amplifier stage. The amplifier 182 may be configured as an amplitude-limiting stage, and may be followed by yet another tunable phase shifter 184.

The phase shifters 180 and 184 may be generally configured in a manner similar to the phase shifter 172, but may have differing component values to accommodate different resolution levels. In any case, the phase shifters 172, 180 and 184 may be generally directed to improving the capacitive matching of the two feedback paths. Alternatively or additionally, any one or all of the phase shifters 172, 180, 184 may be directed to establishing a desired mismatch between the feedback paths in the interest of avoiding overcompensation. For example, one of the phase shifters may be configured to present a desired, small mismatch by slightly increasing the effective capacitance for the feedback path leading to the resonator 152. The small mismatch may be introduced after coarse and fine tuning adjustments involving the other phase shifters resulted in symmetrical or balanced paths. In this way, the device 150 can accommodate changes in the feedthrough capacitance of the resonator 152 that may result during operation and that would otherwise result in overcompensation.

Turning now to FIG. 16, a device indicated generally at 190 includes four amplification stages similar to those described above in connection with the embodiment of FIG. 15, but arranged in a differential output configuration. In this case, a resonator 192 is arranged in a feedback path 194 leading from a first output node or terminal 196 to an input node or terminal 198. The compensation capacitance $C_0$ is arranged in a second feedback path 200 between the input node 198 and a second output node or terminal 202. An input phase shifter 204 and amplifier 206 of the first amplifier stage are coupled to the input terminal 198 and a ground terminal 208 as shown. Other than the input terminal connections, the phase shifter 204 and the amplifier 206 may be similar to the corresponding devices in the device 150 of FIG. 15. Other elements of the device 190 in common with FIG. 15 are identified with like reference numerals.

The above-described active compensation techniques may utilize any type of capacitance or capacitor as the compensation capacitance $C_0$ shown in FIGS. 15 and 16, including a resonator-based capacitance as described above in connection with FIG. 5. For instance, a differential input or output amplifier configuration may be applied to a resonator array context as shown in the example of FIG. 12D or as follows. In a differential input configuration, the resonator array may be driven by the amplifier output, after which half of the resonators feed the inverting input of the first amplification stage and the other half of the resonators feed the non-inverting input of the first amplification stage. One or more of the phase shifters may then be adjusted and otherwise utilized to arrive at a desired offset, or degree to which the paths are balanced.

The foregoing examples are provided with the understanding that a variety of types of differential amplifiers may be utilized to implement the active compensation techniques described herein.

The above-described feedthrough capacitance compensation techniques may be used for any application or context where an increase in the device peak-to-feedthrough ratio is useful. Examples of such applications and contexts include without limitation:

Single frequency oscillators;
Ability to operate at very low resonator bias levels;
Reconfigurable oscillators;
Frequency hopping oscillators;
FSK modulation of oscillators; and,
Selectable MEMS filter banks.

Single Frequency Oscillators—One of the major difficulties in electrostatic MEMS resonators used for oscillators is the occurrence of parasitic oscillation. Oscillation occurs when the overall loop gain is greater than one and the phase shift is zero or a multiple of 360 degrees. For most MEMS resonators, the oscillator circuit is typically a series feedback element. That is, the resonator is used in series with the gain path. At resonance, the resonator is at a low insertion loss and the phase across the resonator is zero degrees. Therefore, the active electronics provide enough gain to overcome the resonator loss and have the correct phase shift. However, at a higher frequency, the feedthrough capacitance of the resonator causes the insertion loss of the resonator to decrease proportional to the feedthrough capacitance. Therefore, if the active electronics of the oscillator have enough gain, the oscillator can oscillate at a much higher and unintended frequency.

Feedthrough capacitance compensation causes the feedthrough capacitance of the device to greatly decrease. Through implementation of the above-described techniques, the feedthrough decreases with frequency rather than increases. Accordingly, parasitic oscillation does not occur.

Ability to Operate at Very Low Bias Levels—Typically, the bias level needs to be reasonably high in order to increase the peak-to-feedthrough ratio set by the reactance of the feedthrough capacitance and the motional resistance. However, if the feedthrough level drops as a result of feedthrough capacitance compensation, then the range of values of motional resistance (Rx) could be considerably higher to still maintain a reasonable peak-to-feedthrough ratio. By allowing a higher motional resistance (Rx), the resonator can operate at a much lower bias voltage.

Use a Very Stiff Device Structure—Using a very high stiffness structure typically implies that the motional resistance is quite high, and often, the peak-to-feedthrough ratio is quite low due to the low displacement for a given signal amplitude. Using a high stiffness device has several advantages, including the ability to use high signal amplitudes, resistance to mechanical shock and vibration, and overall robustness. The use of feedthrough capacitance compensation may enable the use of very high stiffness devices by greatly improving the peak-to-feedthrough ratio of the device.

Reconfigurable Oscillators—The above-described compensation techniques may be applied to oscillators that can be reconfigured by placing several resonators in parallel and simply selecting the resonator by applying a bias to that particular resonator. Without the compensation, the parallel arrangement would conventionally not be possible because the feedthrough capacitances of all of the devices in parallel would add, resulting in a large feedthrough. By implementing feedthrough capacitance compensation, configurable oscillators may rely upon a large number of resonators, thereby providing a desired amount of frequency resolution.

Frequency Hopping Oscillators—As with the reconfigurable oscillator, feedthrough capacitance compensation would enable a large number of oscillators to be placed in parallel. By applying a bias to one, that resonator is selected. If the bias is then switched to another device, the oscillation frequency would switch to the resonant frequency of the other device. Switching frequencies could be used to synthesize a variety of waveforms. Frequency hopping is a general method for reducing interference in communication links. Depending on the hopping rate, it could also be an enabling technology for applications that require very fast or wide hop rates, which may be implemented by refreshing phase locked loop (PLL) circuitry. One exemplary application involves frequency sources for frequency hopping radar systems, but there are a wide variety of other uses outside of communications and radar.

FSK Modulating Oscillators—As with frequency hopping oscillators, direct FSK (frequency shift keying) modulation could be applied by switching between two resonators in parallel in the feedback path of the oscillator. This typically would not be possible without feedthrough capacitance compensation due to the very large feedthrough capacitance of the device.

Selectable MEMS Filter Banks—It has often been proposed to use many electrostatic MEMS devices in parallel for selectable filter banks with selection of the given filter band based on applying a bias voltage to a given filter. However, the prototyping of such filter banks may result in very poor isolation due to the feedthrough capacitance of the individual resonators. However, application of the disclosed feedthrough capacitance compensation techniques may enable such filter structures.

The foregoing compensation techniques and device designs may be used with resonators capable of operation in response to a variety of input signals. For example, the resonators may be coupled to an input node that provides a steady-state, time-varying input signal.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

The foregoing description is given for clearness of understanding only, and no unnecessary limitations should be understood therefrom, as modifications within the scope of the invention may be apparent to those having ordinary skill in the art.

What is claimed is:

1. A device having an input node to receive an input signal and an output node to provide an output signal, the device comprising:
   a differential amplifier coupled to the input and output nodes;
   a resonator disposed in a first feedback path of the differential amplifier and characterized by a transducer to drive the output node, and further characterized by a feedthrough capacitance such that portions of the input signal bypass the transducer to reach the output node; and,
   a compensation capacitance disposed in a second feedback path of the differential amplifier separate from the first feedback path to offset the feedthrough capacitance;
   wherein the compensation capacitance is below the feedthrough capacitance such that a compensation signal in the second feedback path and the portions of the input signal in the first feedback path are unmatched to avoid overcompensation.

2. The device of claim 1, wherein the first and second feedback paths are configured in a differential input scheme.

3. The device of claim 2, wherein an inverting output of the differential amplifier is coupled to an unconnected pad.

4. The device of claim 1, wherein the first and second feedback paths are configured in a differential output scheme.

5. The device of claim 4, wherein an inverting input of the differential amplifier is coupled to an unconnected pad.

6. The device of claim 1, further comprising a series of amplification stages, one of which comprises the differential amplifier.

7. The device of claim 1, further comprising a phase shifter having components coupled to one or both of the first and second feedback paths for relative tuning of the first and second feedback paths.

8. The device of claim 7, wherein the components of the phase shifter are tuned such that the first and second feedback paths are unmatched to avoid overcompensation.

9. The device of claim 1, further comprising an array of resonators comprising the resonator and a set of compensation capacitances to offset a respective feedthrough capacitance of each resonator in the array, the set comprising the compensation capacitance, wherein each resonator of the array is disposed in parallel with the first feedback path and each compensation capacitance of the set is disposed in parallel with the second feedback path.

10. The device of claim 9, wherein each resonator of the array is a micromechanical resonator and wherein each compensation capacitance of the set comprises an unbiased micromechanical resonator.

11. A device having an input node to receive an input signal and an output node to provide an output signal, the device comprising:
    a resonator coupled to the input and output nodes, characterized by a transducer to drive the output node, and further characterized by a feedthrough capacitance such that portions of the input signal bypass the transducer to allow a spurious signal to reach the output node;
    a compensation capacitor coupled to the output node to define a compensation capacitance in accordance with the feedthrough capacitance; and,
    a phase inversion circuit coupled to the compensation capacitance to generate a compensation signal and coupled to the output node such that the spurious signal is offset by the compensation signal;
    wherein the compensation capacitor is configured such that the compensation capacitance is below the feedthrough capacitance such that the compensation signal and the spurious signal are unmatched to avoid overcompensation.

12. The device of claim 11, wherein the phase inversion circuit comprises an LC circuit configured to provide a 180 degree phase shift.

13. The device of claim 11, wherein the phase inversion circuit comprises a center-tapped transformer.

14. The device of claim 11, wherein the resonator is a micromechanical resonator.

15. The device of claim 11, wherein the phase inversion circuit comprises a differential amplifier and wherein the compensation capacitor and the resonator are coupled to the differential amplifier in first and second feedback paths, respectively.

16. The device of claim 15, further comprising a series of amplification stages, one of which comprises the differential amplifier.

17. The device of claim 15, further comprising a phase shifter having components coupled to one or both of the first and second feedback paths for relative tuning of the first and second feedback paths.

18. The device of claim 17, wherein the components of the phase shifter are tuned to unmatch the first and second feedback paths to establish an offset between the spurious signal and the compensation signal to avoid the overcompensation.

19. The device of claim 11, further comprising a parallel array of resonators comprising the resonator, and further comprising a parallel set of compensation capacitors to offset a respective feedthrough capacitance of each resonator in the array, the set comprising the compensation capacitor.

20. The device of claim 19, wherein each resonator of the parallel array comprises a micromechanical resonator, and wherein each compensation capacitor of the parallel set comprises an unbiased micromechanical resonator.

21. The device of claim 11, wherein the compensation capacitor is tunable.

22. A device having an input node to receive an input signal and an output node to provide an output signal, the device comprising:
- a parallel array of resonators comprising a resonator coupled to the input and output nodes, the resonator characterized by a transducer to drive the output node, and further characterized by a feedthrough capacitance such that portions of the input signal bypass the transducer to allow a spurious signal to reach the output node;
- a parallel set of compensation capacitors to offset a respective feedthrough capacitance of each resonator in the array, the set comprising a compensation capacitor coupled to the output node to define a compensation capacitance in accordance with the feedthrough capacitance; and,
- a phase inversion circuit coupled to the compensation capacitance to generate a compensation signal and coupled to the output node such that the spurious signal is offset by the compensation signal;
- wherein the compensation capacitor is configured such that the compensation signal and the spurious signal are unmatched to avoid overcompensation.

23. The device of claim 22, wherein each resonator of the parallel array comprises a micromechanical resonator, and wherein each compensation capacitor of the parallel set comprises an unbiased micromechanical resonator.

24. A device having an input node to receive an input signal and an output node to provide an output signal, the device comprising:
- a differential amplifier coupled to the input and output nodes;
- a resonator disposed in a first feedback path of the differential amplifier and characterized by a transducer to drive the output node, and further characterized by a feedthrough capacitance such that portions of the input signal bypass the transducer to reach the output node; and,
- a compensation capacitance disposed in a second feedback path of the differential amplifier separate from the first feedback path to offset the feedthrough capacitance;
- wherein the first and second feedback paths are configured in a differential input scheme.

25. The device of claim 24, wherein an inverting output of the differential amplifier is coupled to an unconnected pad.

26. A device having an input node to receive an input signal and an output node to provide an output signal, the device comprising:
- a differential amplifier coupled to the input and output nodes;
- an array of resonators comprising a resonator disposed in a first feedback path of the differential amplifier and characterized by a transducer to drive the output node, and further characterized by a feedthrough capacitance such that portions of the input signal bypass the transducer to reach the output node; and,
- a set of compensation capacitances to offset a respective feedthrough capacitance of each resonator in the array, the set comprising a compensation capacitance disposed in a second feedback path of the differential amplifier separate from the first feedback path to offset the feedthrough capacitance;
- wherein each resonator of the array is disposed in parallel with the first feedback path and each compensation capacitance of the set is disposed in parallel with the second feedback path.

27. The device of claim 26, wherein each resonator of the array is a micromechanical resonator and wherein each compensation capacitance of the set comprises an unbiased micromechanical resonator.

* * * * *